US006951825B2

(12) United States Patent
Li et al.

(10) Patent No.: US 6,951,825 B2
(45) Date of Patent: *Oct. 4, 2005

(54) METHOD OF ETCHING A SIN/IR/TAN OR SIN/IR/TI STACK USING AN ALUMINUM HARD MASK

(75) Inventors: Tingkai Li, Vancouver, WA (US); Bruce D. Ulrich, Beaverton, OR (US); David R. Evans, Beaverton, OR (US); Sheng Teng Hsu, Camas, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 87 days.

This patent is subject to a terminal disclaimer.

(21) Appl. No.: 10/391,294

(22) Filed: Mar. 17, 2003

(65) Prior Publication Data

US 2004/0185669 A1 Sep. 23, 2004

(51) Int. Cl.[7] .............................................. H01L 21/302
(52) U.S. Cl. ....................... 438/724; 438/229; 438/757
(58) Field of Search ................... 438/3, 229, 690–692, 438/706, 710, 714, 724, 740, 757, 239, 720, 744

(56) References Cited

U.S. PATENT DOCUMENTS 6,027,861 A * 2/2000 Yu et al. ..................... 430/316
6,090,697 A * 7/2000 Xing et al. .................. 438/618
6,274,899 B1 * 8/2001 Melnick et al. ............. 257/298
6,635,185 B2 * 10/2003 Demmin et al. .............. 216/64
6,673,664 B2 * 1/2004 Hsu et al. ................... 438/229
2001/0036744 A1 * 11/2001 Taravade et al. ............ 438/729

OTHER PUBLICATIONS

Rossnagel et al., Handbook of Plasma Processing, 1990, Noyes Publications, p. 209.*
Wolf, Silicon Processing for the VLSI Era, 2002, vol. 4, Lattice Press, pp. 145–146.*
Callister, Materials Science and Engineering, 1997, 4th ed., John Wiley & Sons, p. 626.*

* cited by examiner

Primary Examiner—Nadine G. Norton
Assistant Examiner—Eric B. Chen
(74) Attorney, Agent, or Firm—David C. Ripma; Joseph P. Curtin

(57) ABSTRACT

A method of etching includes preparing a substrate; depositing a first etch stop layer; forming an iridium bottom electrode layer; depositing a SiN layer; depositing and patterning an aluminum hard mask; etching a non-patterned SiN layer with a SiN selective etchant, stopping at the level of the iridium bottom electrode layer; etching the first etch stop layer with a second selective etchant; depositing an oxide layer and CMP the oxide layer to the level of the remaining SiN layer; wet etching the SiN layer to form a trench; depositing a layer of ferroelectric material in the trench formed by removal of the SiN layer; depositing a layer of high-k oxide; and completing the device, including metallization.

13 Claims, 4 Drawing Sheets

METHOD OF ETCHING A SIN/IR/TAN OR SIN/IR/TI STACK USING AN ALUMINUM HARD MASK

FIELD OF THE INVENTION

The present Invention relates to etching processes, and specifically to an etching technique for use in the fabrication of a one-transistor non-volatile memory device having a SiN/Ir/TaN or SiN/Ir/Ti stack.

BACKGROUND OF THE INVENTION

MFMPOS (Metal, Ferroelectric, Oxide, and Silicon) one-transistor ferroelectric memory devices have been proposed. Development work on ferroelectric-gate controlled devices began as early as the 1950s. Although many different gate stacks have been reported, such as metal-ferroelectric-silicon (MFS) FETs, Metal-Ferroelectric-Insulator-Silicon (MFIS) FETs, Metal-Ferroelectric-Metal-Silicon (MFMS) FETs, and Metal-Ferroelectric-Metal-Oxide-Silicon (MFMOS) FETs, these devices all have a one transistor (1T) memory cell structure. When compared to its one transistor-one capacitor (1T-1C) memory cell counterpart, the 1T ferroelectric memory has a smaller memory cell size and has a significant advantage: it provides non-destructive read out (NDRO). Because of the difficulty in forming a clean ferroelectric-semiconductor interface, the MFMPOS memory cell structure is presented herein. In order to fabricate a MFMPOS 1T device, a SiN/Ir/TaN or SiN/r/Ti stack must be etched. This is a critical issue and is made difficult because Ir and SiN have poor selective etching characteristics.

SUMMARY OF THE INVENTION

A method of etching includes preparing a substrate; depositing a first etch stop layer; forming an iridium bottom electrode layer; depositing a SiN layer; depositing and patterning an aluminum hard mask; etching a non-patterned SiN layer with a SiN selective etchant, stopping at the level of the iridium bottom electrode layer; etching the first etch stop layer with a second selective etchant; depositing an oxide layer and CMP the oxide layer to the level of the remaining SiN layer; wet etching the SiN layer to form a trench; depositing a layer of ferroelectric material in the trench formed by removal of the SiN layer; depositing a layer of high-k oxide; and completing the device, including metallization.

It is an object of the invention to provide an etching technique which is useful with iridium and silicon nitride-containing structures.

Another object of the invention is to provide a two step etching process using an aluminum hard mask to etch a SiN/Ir/TaN stack or a SiN/Ir/Ti stack for use in MFMPOS one-transistor memory applications.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

Etching of SiN/Ir/TaN or SiN/r/Ti stacks is critical issue in the fabrication process of Metal-Ferroelectric-Oxide-Silicon (MFMPOS) one-transistor (1T) devices. Because of the poor selective etching properties of iridium and silicon nitride, it is difficult to etch SiN/Ir/TaN or SiN/r/Ti stacks. The method of the invention includes a two-step etching process and using an aluminum hard mask.

The method of the invention includes an etchant formula to etch SiN, referred to herein as a first etchant or a SiN selective etchant, stopping at an Ir layer, using aluminum as a hard mask. This is also referred to herein as a nitride etchant recipe: $C_4F_8:Ar:O_2=8:2:1$, used at a microwave plasma power of between about 400 w to 600 w, and an RF power of between about 150 w to 250 w.

A second selective etchant formula is: $CF_4:Ar:Cl=8:2:1$, at a microwave plasma power of between about 400 w to 600 w, and an RF power of between about 150 w to 250 w. This formula is referred to herein as the iridium etchant recipe, and is used for etching Ir/TaN and Ir/Ti, again, using an aluminum hard mask. The etch rates for SiN, Al, and Ir using nitride etchant recipe and the iridium etchant recipe are listed in Tables 1 and 2, respectively.

In the first etching step of the method of the invention, the nitride etchant recipe is used to etch a SiN layer, stopping at Ir the level of an iridium layer, using an aluminum hard mask. In the second etching step of the method of the invention, a Ir/TaN layer and/or a Ir/Ti layer is etched using the iridium etchant recipe and an aluminum hard mask. The fabrication of an nMOS IT MFMPOS memory device begins with STI isolation on a p-type silicon substrate. The integration processes including Ir/Ti or TaN and polysilicon gate, nitride gate replacement, MOCVD selective deposition, CMP, deposition and annealing of high k gate oxides, Pt top electrode, ILD and contact hole etching and metallization, etc., are used for fabrication of a one-transistor memory device according to the MOI, as shown in FIGS. 1–8.

Figure 1:
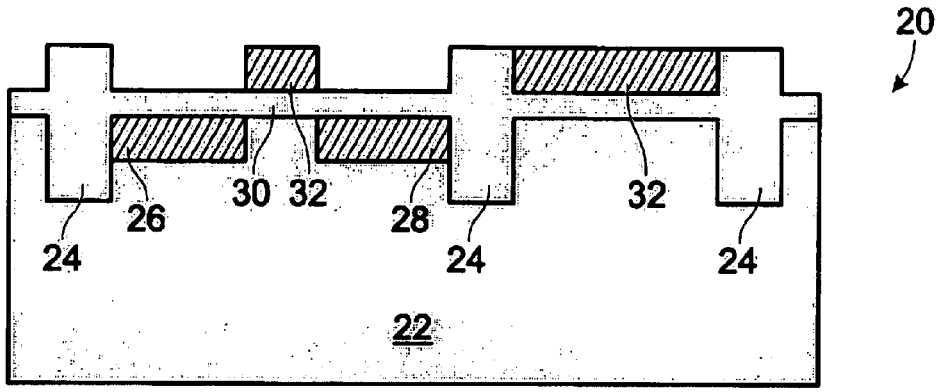
FIGS. 1–8 depict successive steps in practicing the method of the invention.

FIG. 1 depicts an early structure configuration of a device constructed according to the method of the invention, generally at 20, wherein the view at the right side of the figure is taken normal to the view on the left side of the figure, and through the gate portion of the structure. Similar views are presented in FIGS. 2–8. FIG. 1 depicts a substrate 22 and STI oxide regions 24. A source 26 and a drain 28 are N+ regions which have been the subject of a threshold adjustment ion implantation. A gate oxide region is shown at 30, and a polysilicon layer, which is formed by CVD, is shown at 32.

Figure 2:
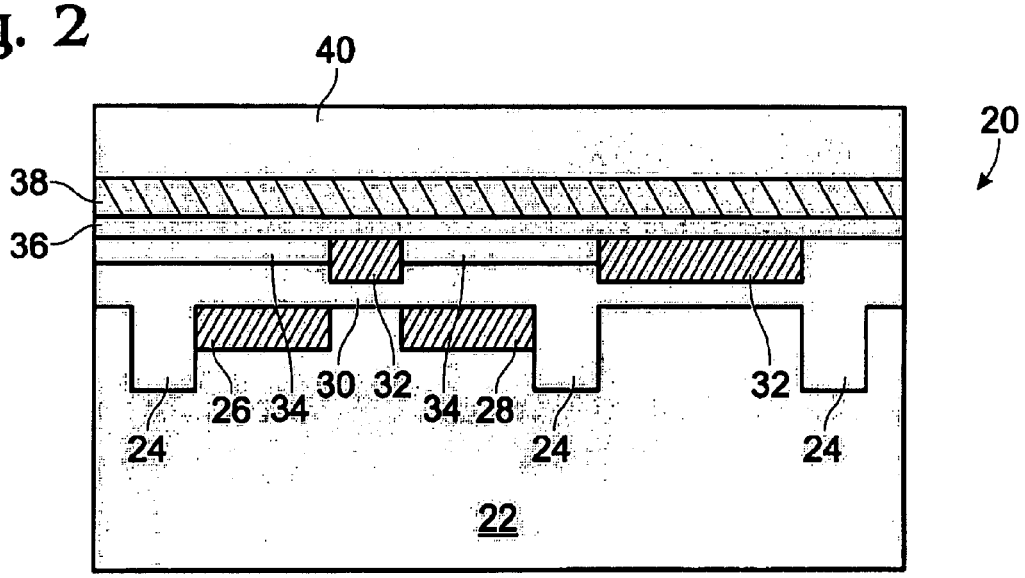

Referring to FIG. 2, after polysilicon layer 32 is formed, the steps of STI of photoresist, re-oxidation, CVD of an oxide layer 34, CMP of oxide layer 34 to the level of polysilicon layer 32, etching of the structure through polysilicon layer 32, and N+ ion implantation into source 26 and drain 28 are performed. Deposition of a Ti or TaN layer 36, also referred to herein as a first etch stop layer, by CVD is performed, after which iridium bottom electrode 38 is formed by electron beam evaporation, and a layer of SiN 40 is formed by CVD.

Figure 3:
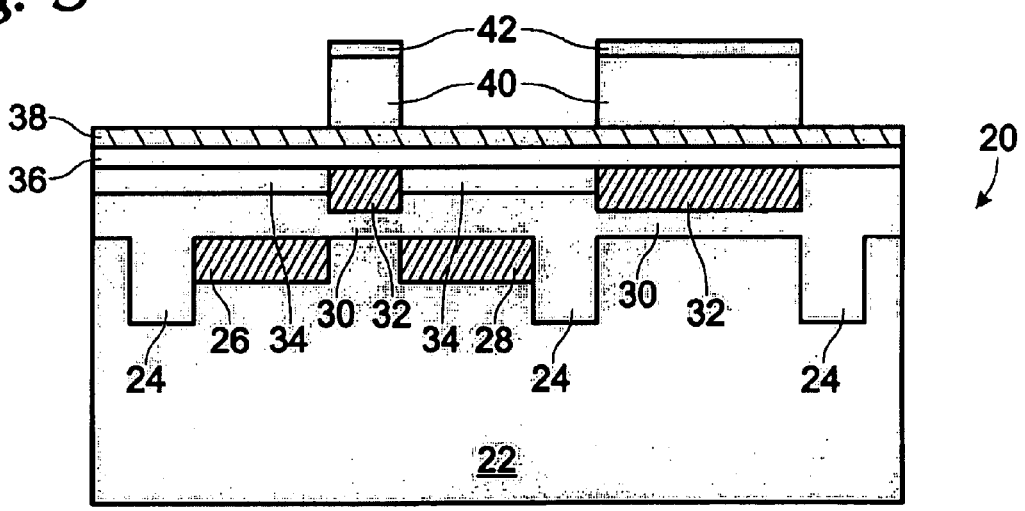
Figure 4:
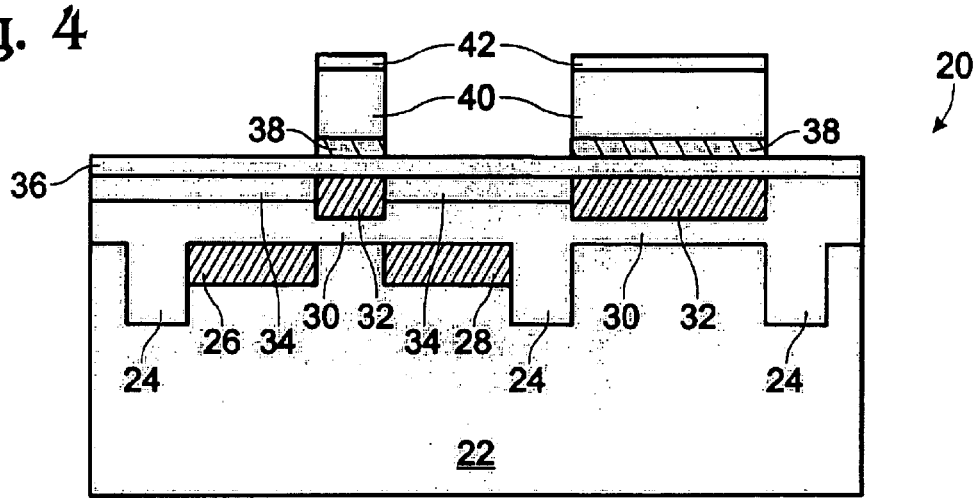
Figure 5:
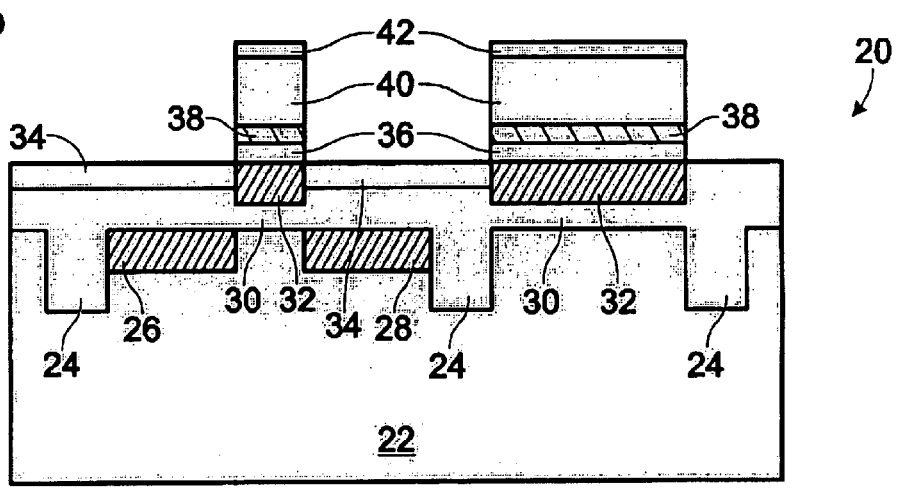

FIG. 3 depicts the structure following deposition and patterning of an aluminum hard mask 42 and etching of SiN layer 40 in the first etching step of the method of the invention, which etching stops at iridium bottom electrode 38. FIG. 4 depicts etching of iridium bottom electrode 38, which stops at the level of the Ti or TaN layer 36. The Ti or TaN layer is then etched in the second etching step of the method of the invention, as depicted in FIG. 5.

Figure 6:
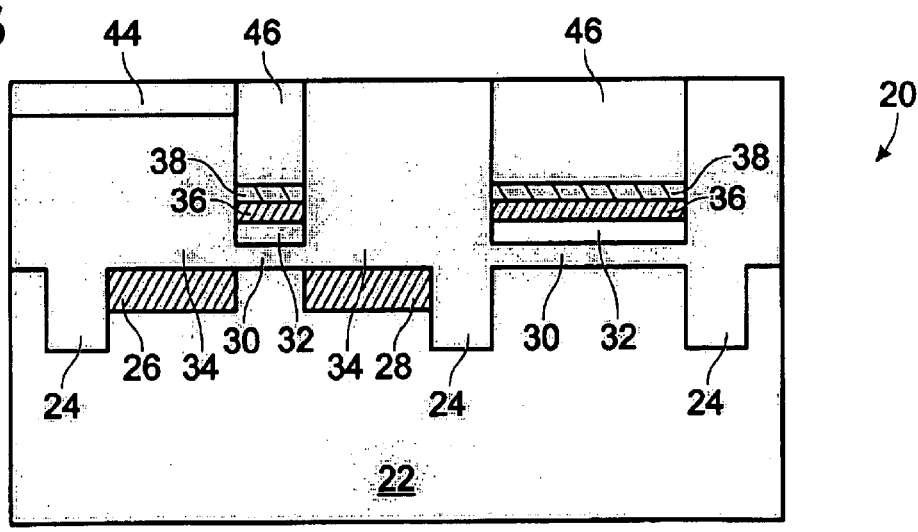

FIG. 6 depicts the structure following deposition of an oxide layer 44, and CMP of oxide layer 44, which stops at the level of SiN layer 40, removing aluminum hard mask 42, and subsequent wet etching of SiN layer 40. A layer 46 of ferroelectric thin film material is selectively deposited by MOCVD, and the ferroelectric thin film is smoothed by CMP.

Figure 7:
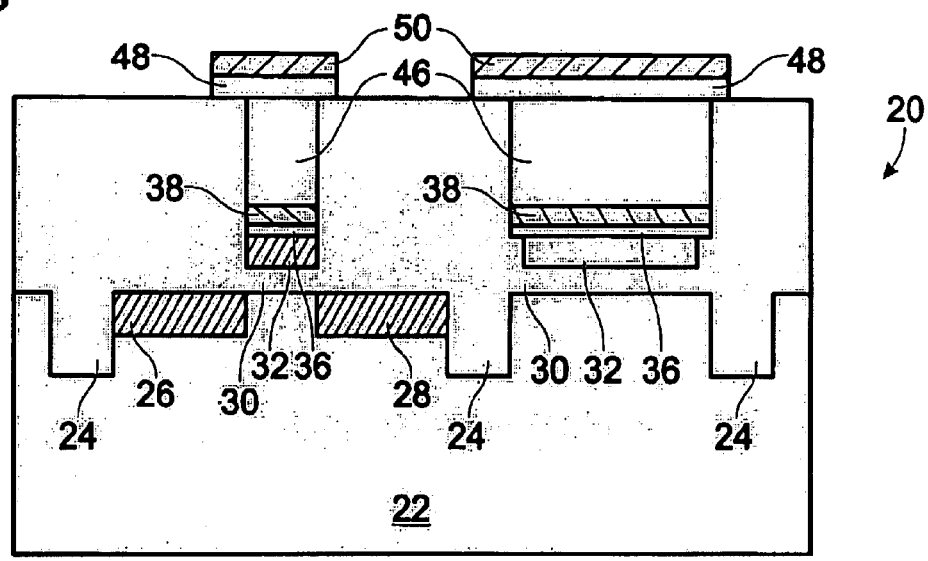
Figure 8:
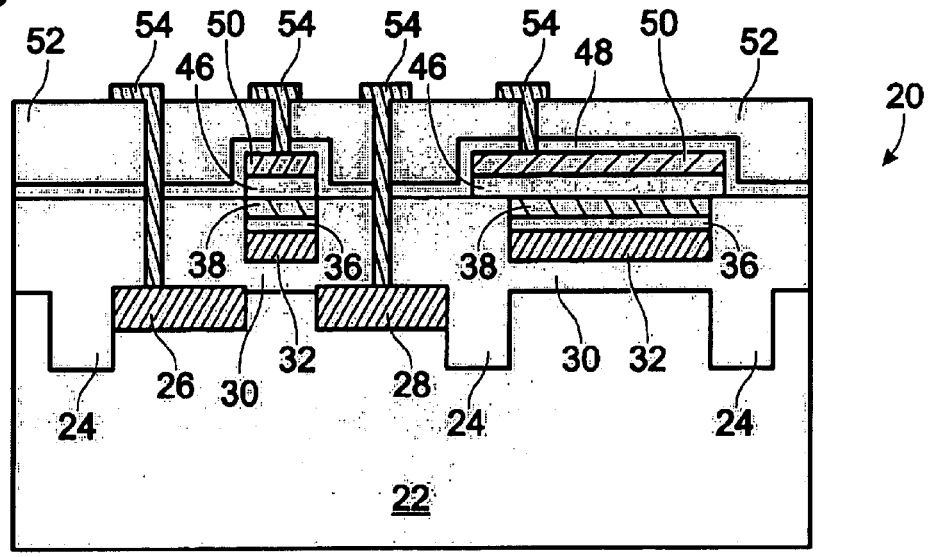

FIG. 7 depicts the deposition and annealing of a high k oxide layer 48, such as $HfO_2$ or $TiO_2$, deposition of a platinum top electrode 50, which is followed by patterning and etching of the top electrode. The final structure is depicted in FIG. 8, which includes a $HfO_2$ or $TiO_2$ thin film 48, and oxide layer 52, and the requisite etching for contact holes, followed by metallization 54.

TABLE 1

| | Materials | | |
|---|---|---|---|
| | SiN | Al | Ir |
| Etch rates (Å/min) | ~2800 | ~90 | ~20 |

TABLE 2

| | Materials | | |
|---|---|---|---|
| | SiN | Al | Ir |
| Etch rates (Å/min) | ~1500 | ~200 | ~450 |

Figure 9:
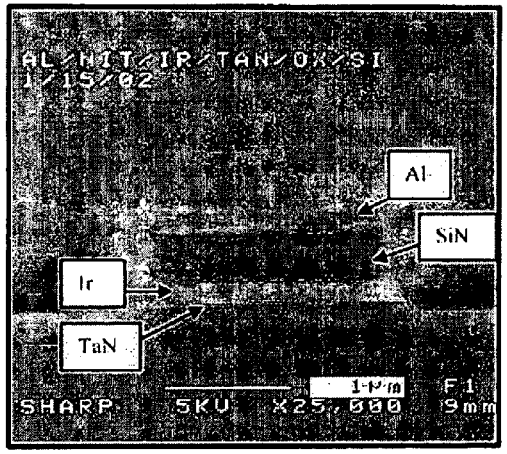
FIG. 9 is a SEM cross section of a SiN/Ir/TaN stack at 25Kx after etching using the method of the invention.
Figure 10:
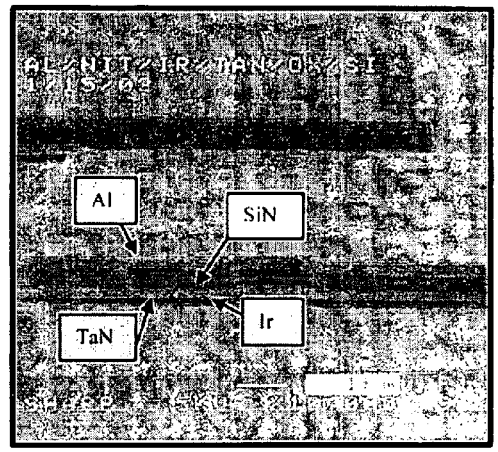
FIG. 10 is a SEM cross section of the SiN/Ir/TaN stack of FIG. 1 at 10Kx.
Figure 11:
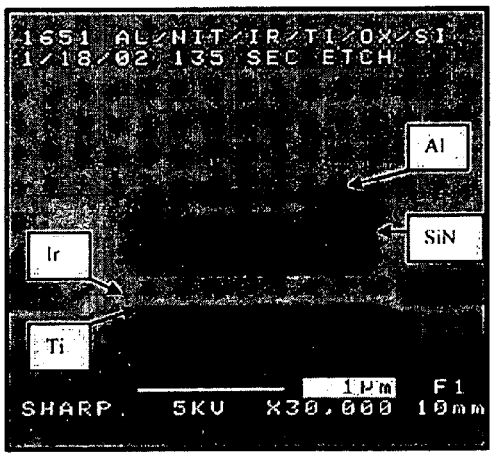
FIG. 11 is a SEM cross section of a SiN/Ir/Ti stack at 30Kx after etching using the method of the invention.
Figure 12:
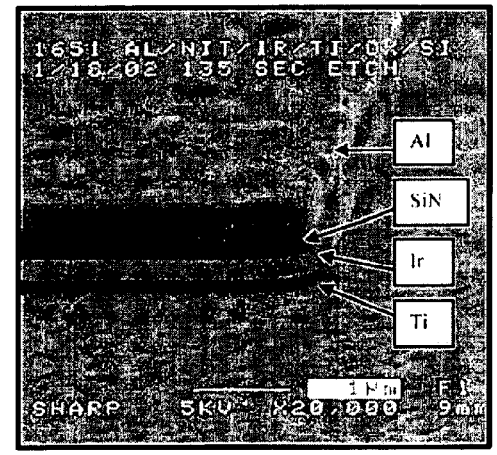
FIG. 12 is a SEM cross section of the SiN/Ir/Ti stack of FIG. 3 at 20Kx.

FIG. 9 and FIG. 10 show the SEM cross section of SiN/Ir/TaN stack after etching according to the method of the invention. FIG. 11 and FIG. 12 show the SEM cross section of SiN/Ir/Ti stack after etching according to the second step of the method of the invention. FIGS. 9–12 demonstrates that the method of the invention is suitable for use in ferroelectric memory fabrication, and is particularly useful in nitride replacement gate applications wherein a nitride sacrificial layer is replaced with a ferroelectric memory material, such as lead gemianium oxide ($Pb_5Ge_3O_{1r}$) (PGO). In ferroelectric memory transistor fabrication, a thick layer of oxide generally is deposited onto the wafer after etching of a sacrificial gate stack. The wafer is then CMP plannarized and the nitride is removed. After nitride removal, it is preferred to clean the residual oxide. During that cleaning process the gate trench is slightly enlarged. As is shown in the SEM micro-photographs the Ir bottom electrode is slightly larger than the nitride. This insures that the ferroelectric memory gate will not be deposited outside of the Ir bottom electrode.

Thus, a method for SiN/Ir/TaN or SiN/Ir/Ti stack etching using Al hard mask has been disclosed. It will be appreciated that further variations and modifications thereof may be made within the scope of the invention as defined in the appended claims.

We claim:

1. A method of etching comprising:

preparing a substrate;

depositing a first etch stop layer taken from the group of materials consisting of Ti and TaN;

forming an iridium bottom electrode layer;

depositing a SiN layer;

depositing and patterning an aluminum hard mask;

etching a non-patterned SiN layer with a first etchant consisting of $C_4F_8$:Ar:$O_2$=8:2:1, used at a microwave plasma power of between about 400 w to 600 w, and an RF power of between about 150 w to 250 w, stopping at the level of the iridium bottom electrode layer;

etching first etch stop layer with a second etchant consisting of $CF_4$: Ar:Cl=8:2:1, used at a microwave plasma power of between about 400 w to 600 w, and an RF power of between about 150 w to 250 w;

depositing an oxide layer and CMP the oxide layer to the level of the remaining SiN layer;

wet etching the SiN layer to form a trench;

depositing a layer of ferroelectric material in the trench formed by removal of the SiN layer;

depositing a layer of high-k oxide; and completing the device, including metallization.

2. The method of claim 1 wherein said depositing a high-k oxide includes depositing a layer of material taken from the group of high-k oxides consisting of $HfO_2$ and $TiO_2$.

3. The method of claim 1 wherein said depositing a layer of ferroelectric material includes depositing a layer of lead germanium oxide.

4. A method of etching comprising:

preparing a substrate;

depositing a first etch stop layer;

forming an iridium bottom electrode layer;

depositing a SiN layer;

depositing and patterning an aluminum hard mask;

etching a non-patterned SiN layer with a SiN selective etchant, stopping at the level of the iridium bottom electrode layer;

etching the first etch stop layer with a second selective etchant;

depositing an oxide layer and CMP the oxide layer to the level of the remaining SiN layer;

wet etching the SiN layer to form a trench;

depositing a layer of ferroelectric material in the trench formed by removal of the SiN layer;

depositing a layer of high-k oxide; and completing the device, including metallization.

5. The method of claim 4 wherein said depositing a high-k oxide includes depositing a layer of material taken from the group of high-k oxides consisting of $HfO_2$ and $TiO_2$.

6. The method of claim 4 wherein said depositing a layer of ferroelectric material includes depositing a layer of lead germanium oxide.

7. The method of claim 4 wherein said depositing a first etch stop layer; includes depositing a layer taken from the group of materials consisting of Ti and TaN.

8. The method of claim 4 wherein said etching a non-patterned SiN layer with a SiN selective etchant includes preparing a first etchant consisting of $C_4F_8$:Ar:$O_2$=8:2:1, used at a microwave plasma power of between about 400 w to 600 w, and an RF power of between about 150 w to 250 w.

9. The method of claim 4 wherein said etching the first etch stop layer with a second selective etchant includes preparing an etchant consisting of $CF_4$:Ar:C=8:2:1, used at a microwave plasma power of between about 400 w to 600 w, and an RF power of between about 150 w to 250 w.

10. A method of etching comprising:

preparing a substrate;

depositing a first etch stop layer taken from the group of materials consisting of Ti and TaN;

forming an iridium bottom electrode layer;

depositing a SiN layer;

depositing and patterning an aluminum hard mask;

etching a non-patterned SiN layer with a first etchant consisting of $C_4F_8:Ar:O_2=8:2:1$; stopping at the level of the iridium bottom electrode layer;

etching first etch stop layer with a second etchant consisting of $CF_4:Ar:Cl=8:2:1$;

depositing an oxide layer and CMP the oxide layer to the level of the remaining SiN layer;

wet etching the SiN layer to form a trench;

depositing a layer of ferroelectric material in the trench formed by removal of the SiN layer;

depositing a layer of high-k oxide; and completing the device, including metallization.

11. The method of claim 10 wherein said depositing a high-k oxide includes depositing a layer of material taken from the group of high-k oxides consisting of $HfO_2$ and $TiO_2$.

12. The method of claim 10 wherein said depositing a layer of ferroelectric material includes depositing a layer of lead germanium oxide.

13. The method of claim 10 wherein said etching with a first etchant and said etching with a second etchant includes using the etchants at a microwave plasma power of between about 400 w to 600 w, and an RF power of between about 150 w to 250 w.

* * * * *